United States Patent [19]
Yeh

[11] Patent Number: 5,877,628
[45] Date of Patent: Mar. 2, 1999

[54] WARNING DEVICE FOR DETECTING RTC ELECTRICAL CELL

[75] Inventor: Henry Yeh, Chung-Li, Taiwan

[73] Assignee: Twinhead International Corp., Kaohsiung, Taiwan

[21] Appl. No.: 953,168

[22] Filed: Oct. 17, 1997

[51] Int. Cl.$^6$ ................................................ G01N 27/416
[52] U.S. Cl. .......................... 324/433; 324/427; 340/636
[58] Field of Search ..................... 324/426, 427, 324/429, 433, 435, 137, 155, 161; 340/661, 636; 307/64, 66; 320/162; 364/483, 707; 365/227, 229; 395/555, 556; 702/64

[56] References Cited

U.S. PATENT DOCUMENTS

| | | | |
|---|---|---|---|
| 4,517,517 | 5/1985 | Kinney ..................................... | 324/433 |
| 4,521,735 | 6/1985 | Kageyama et al. ...................... | 324/433 |
| 5,072,103 | 12/1991 | Nara ......................................... | 235/492 |
| 5,428,252 | 6/1995 | Walker et al. ............................ | 307/64 |

Primary Examiner—Diep N. Do

[57] ABSTRACT

A warning device for detecting power of a real time clock battery of a computer including a comparator which is connected in parallel to the battery which provides power to a real time clock. The positive input terminal of the comparator is coupled to the positive pole of the battery. The negative input terminal is coupled to the system power supply which is connected to a Zener diode. The Zener diode is in avalanch region to generate a voltage drop which forms a predetermined reference voltage. When the power of the battery is less than the reference voltage, a signal is sent to a chip set in order to generate a warning signal informing that the power will be used up.

2 Claims, 2 Drawing Sheets

WARNING DEVICE FOR DETECTING RTC ELECTRICAL CELL

FIELD OF THE INVENTION

This invention relates to a warning device for detecting RTC battery, particularly to a device which gives off a warning signal, when the power of the battery is going to be used up, in order to avoid the re-setting of the data in the RTC CMOS RAM.

BACKGROUND OF THE INVENTION

In a computer mother board, a RTC(Real-Time Clock)is used for maintaining the data stored in a CMOS. Generally, electrical power is provided to the RTC by a battery arranged on the mother board. If the battery is used up, the data in the RTC CMOS RAM are lost, and consequently the computer cannot boot through the hard disk. If this happens and a new battery is mounted, the data in the RTC CMOS RAM should be set again. It is troublesome to re-set the data. In general the user does not know the function of the battery. In other words, when the computer cannot be booted and a computer technician is called, the technician has no way to evaluate the state of the computer. The technician can only find the causes of failing to boot by using a number of tools to test the functions of the computer one by one, which bothers the customer. When the power of the battery is used up and the computer cannot boot, if the user cannot repair it by himself, then the user can at least tell the warning message to the technician. The technician may then repair the computer by directly replacing a new battery. Thus, the problem may be solved, the maintaining time is shortened and the maintaining cost decreased.

SUMMARY OF THE INVENTION

It is an object of this invention to provide a warning device for detecting a RTC battery inside a computer comprising a comparator which is connected in parallel to the battery which provides power to the RTC. The positive input terminal of the comparator is coupled to the positive pole of the battery. The negative input terminal of the comparator is coupled to the system power supply which is connected to a Zener diode. The Zener diode is in avalanch region to generate a voltage drop which forms a predetermined reference voltage. When the power of the battery is less than the reference voltage, a signal is sent to the chip set in order to generate a warning signal informing that the power will be used up. A new battery will be replaced to avoid the tedious work of setting the data in the RTC CMOS RAM again.

It is another object of this invention to provide another warning device in which the battery voltage is converted into a digital signal by an A/D converter, which signal is transmitted to the system controller through system bus. The system controller decides whether the battery voltage is low and whether a warning signal should be transmitted to inform the user that the power of the battery is used up.

BRIEF DESCRIPTIONS OF THE DRAWING

DETAILED DESCRIPTIONS OF THE INVENTION

Figure 1:
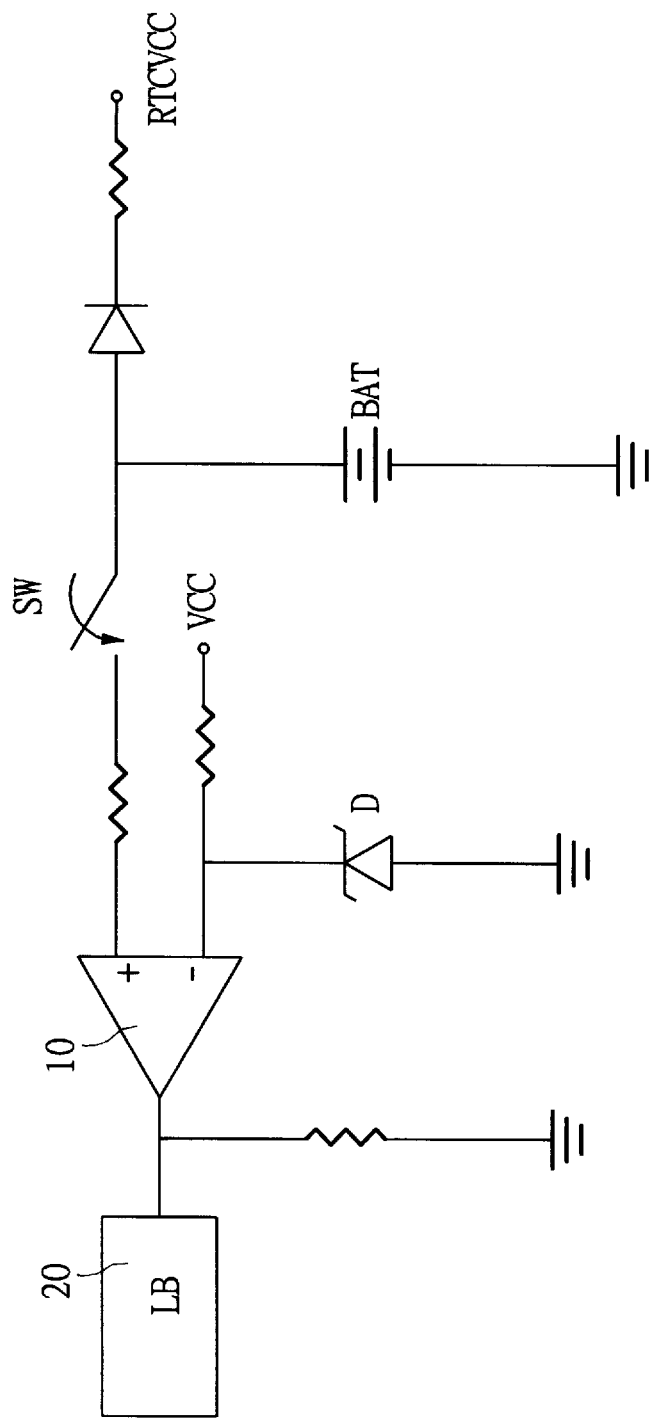
FIG. 1 is a schematic diagram showing a circuit warning device of the present invention.

Please see FIG. 1 which is a circuit diagram of the present invention indicating a battery power detection device. The positive pole of a battery BAT is coupled to two branch circuits. One of the branch circuits, the battery BAT provides electrical power RTCVCC via a diode and a resistor. In the other branch circuit, the battery is coupled to the positive pole of a comparator 10 via a switch SW. The switch SW and the computer power switch can be synchronously turned on or off. The switch SW may be a mechanical switch or an electrical switch. After the switchs are turned off, the switch SW has isolating function in order to prevent the comparator 10 from consuming the power of the battery BAT. At the negative input terminal of the comparator 10, a Zener diode D is connected to system power supply VCC. After avalanch, the voltage drop across the Zener diode D is a predetermined reference voltage. The output terminal of the comparator 10 is connected to a pin LB of the computer chip set 20, i.e. a Low Battery Warning. Generally, personal computers are divided into desktop PC and notebook PC. Both PCs are gradually made of the same chip set 20. The pin LB of the chip set 20 for emitting a low voltage warning originally is used for emitting a power warning for the working battery of a notebook computer. Because the chip set 20 can be used on both the desktop computer and the notebook computer, the pin LB of the chip set 20 can be used to generate a warning message in the present invention.

When the computer is turned on, the switch SW is on, the battery BAT provides electrical power to RTC, and another part of current flows into the positive input terminal of the comparator 10 via switch SW. The system power VCC makes the Zener diode D work in the avalanch region. A reference voltage which is generated at the negative input terminal of the comparator 10 is the voltage drop across the Zener diode D and can be set according to the practical situation. For example, the reference voltage can be set to the lowest voltage which is acceptable and slightly higher than the RTC. When the power of the battery BAT is less than the reference voltage, the comparator 10 sends a message to the LB pin of the chip set 20, and then, the chip set 20 emits a warning signal to inform the user that the power will be used up soon. A new battery BAT can be used to replace the old one in time in order to avoid the tedious work of setting the data in the RTC CMOS RAM again. The warning message can be shown on the screen or the buzzer sounds to warn the user.

Figure 2:
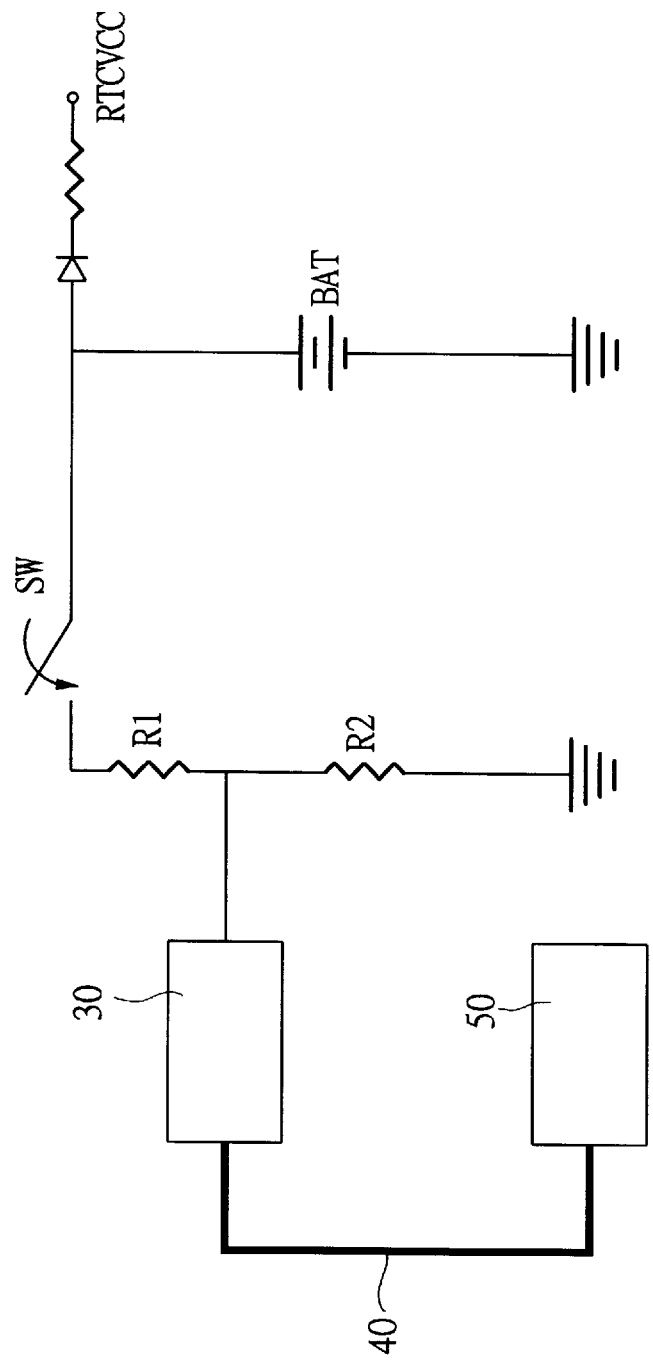
FIG. 2 is a circuit diagram showing another embodiment of the present invention.

Please see FIG. 2 which is another embodiment of the present invention. Two branch circuits are connected from the positive pole of the battery BAT. In one branch circuit, the battery BAT provides power RTCVCC to RTC via a diode and a resistor. In the other branch circuit, two resistors R1 and R2 are connected to form a divider. The node between resistor R1 and resistor R2 is connected to an input terminal of an A/D converter 30. The output of A/D converter 30 is connected to system controller 50 via a system bus 40.

In the second embodiment, the divider voltage across the resistor R2 is converted into a digital signal which is transmitted to system controller 50 via the system bus 40. Then, the system controller 50 decides whether the voltage of the battery BAT is low and whether a warning message should be sent to the user.

I claim:

1. A warning device for detecting power of a real time clock battery of a computer, comprising:

a comparator having a positive input, a negative input, and an output connected to a computer chip set for generating a low battery power warning signal;

a first resistor connected to said positive input of said comparator;

a diode having a first end connected to said real time clock battery, and a second end connected to a second resistor for transmitting the power of said real time clock battery to a real time clock;

a switch connecting said first resistor to said first end of said diode;

a third resistor having a first end connected to said negative input of said comparator, and a second end connected to a system power supply;

a Zener diode connected to said negative input of said comparator; and a fourth resistor connected to said positive input of said comparator.

2. The warning device for detecting power of a real time clock battery of a computer according to claim 1, said switch being an electrical switch.

* * * * *